(12) United States Patent
Engholm

(10) Patent No.: US 6,774,890 B2
(45) Date of Patent: Aug. 10, 2004

(54) TOUCH CONTROLLED ZOOM AND PAN OF GRAPHIC DISPLAYS

(75) Inventor: Kathryn A. Engholm, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 197 days.

(21) Appl. No.: 09/757,316

(22) Filed: Jan. 9, 2001

(65) Prior Publication Data

US 2002/0126099 A1 Sep. 12, 2002

(51) Int. Cl.[7] ................................................. G09G 5/00
(52) U.S. Cl. ....................................... 345/173; 345/174
(58) Field of Search .......................... 345/63, 147, 157, 345/173, 174, 178, 179, 180, 668, 175, 823; 341/20–23, 34; 324/121 R, 76, 121; 178/18–20

(56) References Cited

U.S. PATENT DOCUMENTS

| | | | |
|---|---|---|---|
| 4,040,058 A | | 8/1977 | Mori et al. |
| 4,246,581 A | | 1/1981 | DiToro |
| 4,253,152 A | | 2/1981 | Holdaway |
| 4,532,605 A | * | 7/1985 | Waller ........................ 345/441 |
| 4,578,640 A | | 3/1986 | Crooke et al. |
| 4,695,833 A | | 9/1987 | Ogura et al. |
| 4,755,811 A | * | 7/1988 | Slavin et al. ........... 324/121 R |
| 4,766,425 A | * | 8/1988 | Tallman et al. ............. 345/175 |
| 4,821,030 A | | 4/1989 | Batson et al. |
| 4,823,283 A | * | 4/1989 | Diehm et al. ................ 345/825 |
| 5,025,411 A | | 6/1991 | Tallman et al. |
| 5,119,079 A | * | 6/1992 | Hube et al. .................. 345/823 |
| 5,194,863 A | * | 3/1993 | Barker et al. ................. 341/31 |
| 5,241,308 A | * | 8/1993 | Young ........................... 341/34 |
| 5,321,420 A | | 6/1994 | Rezek et al. |
| 5,365,254 A | | 11/1994 | Kawamoto |
| 5,521,615 A | | 5/1996 | Boyan |
| 5,596,346 A | * | 1/1997 | Leone et al. ................. 345/667 |
| 5,615,384 A | * | 3/1997 | Allard et al. ................ 345/173 |
| 5,631,667 A | | 5/1997 | Cadwell |
| 5,748,185 A | * | 5/1998 | Stephan et al. ............. 345/157 |
| 5,943,013 A | | 8/1999 | Ohashi |
| 6,104,317 A | * | 8/2000 | Panagrossi .................... 341/20 |
| 6,111,400 A | * | 8/2000 | Foster et al. ............ 324/121 R |
| 6,215,467 B1 | * | 4/2001 | Suga et al. ................... 345/472 |
| 6,225,976 B1 | * | 5/2001 | Yates et al. ................... 341/21 |
| 6,263,290 B1 | * | 7/2001 | Williams et al. .............. 702/71 |
| 6,597,347 B1 | * | 7/2003 | Yasutake ..................... 345/173 |

FOREIGN PATENT DOCUMENTS

EP 0651543 A2 * 5/1995

* cited by examiner

Primary Examiner—Vijay Shankar
Assistant Examiner—Prabodh M. Dharia
(74) Attorney, Agent, or Firm—Francis I. Gray

(57) ABSTRACT

A touch controlled zoom and pan of graphic displays is achieved using only a touch screen and rotary knob by designating various areas on a touch screen. Touching one of the designated areas determines the function to be performed—zoom along one axis or in two dimensions or pan along one axis or in two dimensions. The zoom or pan is then performed in response to the rotation of a rotary encoder knob. For panning dragging the touch along an axis in lieu of rotating the rotary encoder knob performs the function. Alternatively the same designated areas may be used to determine either the zoom or pan function by using either a "touch and hold" technique for zoom or a "touch and go" technique for pan.

9 Claims, 3 Drawing Sheets

TOUCH CONTROLLED ZOOM AND PAN OF GRAPHIC DISPLAYS

BACKGROUND OF THE INVENTION

The present invention relates to interactive graphic displays, and more particularly to touch controlled zoom and pan of graphic displays.

In conventional waveform monitoring equipment, such as oscilloscopes, spectrum analyzers, waveform monitors and the like, a waveform display is controlled by a gain and a position control in each of the x and y axes. This originally required four knobs, and the interaction between gain and offset is usually awkward. Changing the gain generally requires changing the offset, or position, to keep a certain point of the waveform on the display.

A method of touch controlled zoom of waveform displays is shown in U.S. Pat. No. 4,755,811 issued on Jul. 5, 1988. In this method a finger or other pointer device is used to touch a point on a waveform about which zoom is desired. Function buttons for moving or expanding the waveform display and for determining the axis of such movement or expansion operate in conjunction with a rotary encoder. Zooming is achieved by contacting the screen overlying a point on the waveform about which zoom is desired, and such contact and the activation of an expand button results in movement of the rotary encoder providing a gain parameter to a zoom function. Another button determines the axis along which zoom occurs. Thus zooming or panning occurs along a single axis according to the parameters defined by a couple of function buttons using only a touch pointer and a rotary encoder.

In graphics systems as shown in U.S. Pat. No. 4,532,605 issued on Jul. 30, 1985 zooming was accomplished by encompassing an area with a bounding box and then expanding the contents of the bounding box to encompass the entire screen. This produced zooming in both dimensions without using a touch screen.

What is desired is the ability to zoom or pan in either one or two dimensions without the need for function buttons, but only through using a touch screen and rotary knob.

BRIEF SUMMARY OF THE INVENTION

Accordingly the present invention provides a method of touch controlled zoom and pan of graphics images using only a touch screen with defined areas and a rotary encoder knob. The touch screen has horizontal axis and vertical axis areas, optional horizontal scroll and vertical scroll areas, and a graphics display area in which the graphic information, such as a waveform, is displayed. Touching one of the defined perimeter areas determines the function—pan or scroll—and rotating the knob performs the selected function according to the direction of rotation of the knob—zoom in/out or pan up/down/left/right. Alternatively the function may also be determined by "touch and hold" for zoom and "touch and go" for pan. Touching the graphics display area results in a two dimensional zoom or pan according to the selected function.

The objects, advantages and other novel features are apparent from the following detailed description when read in conjunction with the appended claims and attached drawing.

DETAILED DESCRIPTION OF THE INVENTION

Figure 1:
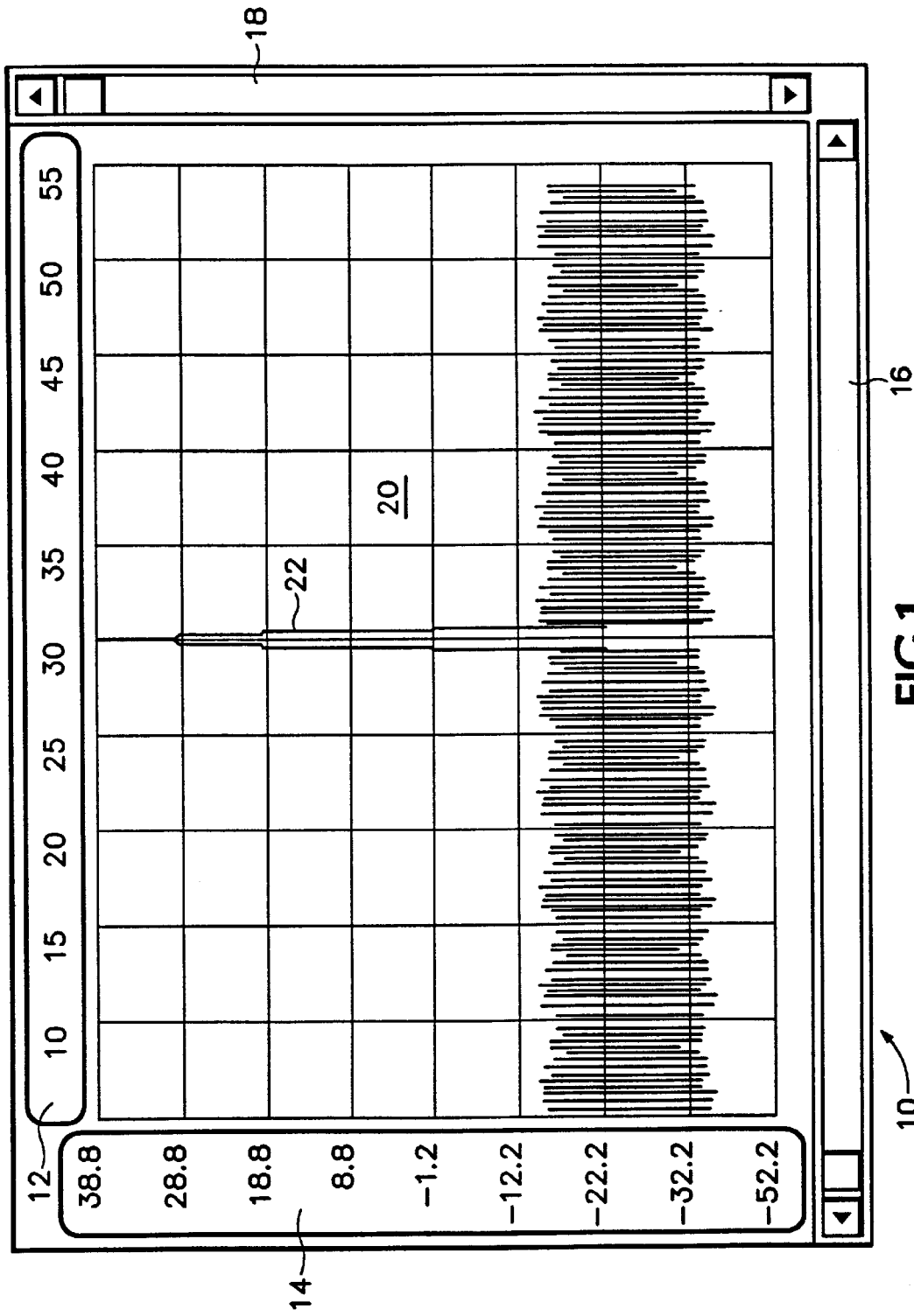
FIG. 1 is a plan view of a display screen suitable for touch controlled pan and zoom of a graphics display according to the present invention.
Figure 2:
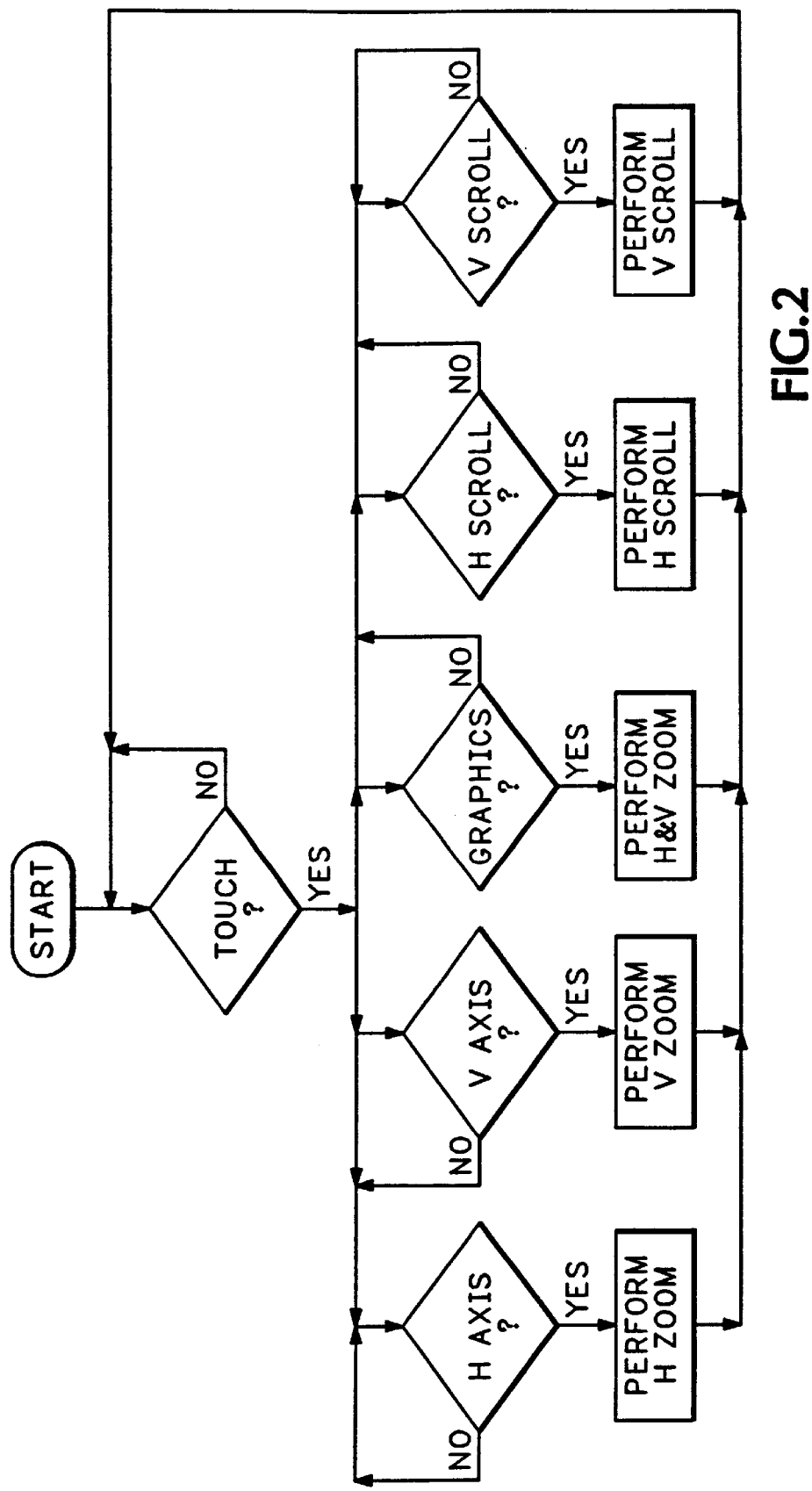
FIG. 2 is a flow chart view of a method for touch controlled zoom and pan of a graphics display according to the present invention.

Referring now to FIG. 1 a touch screen 10 is shown having an upper horizontal axis area 12, a left-side vertical axis area 14, a bottom horizontal scroll area 16, a right-side vertical scroll area 18 and a central graphics area 20. In the graphics area 20 is displayed a waveform 22, and on the front panel of the instrument with the touch screen 10 is a rotary knob (not shown). Touching the touch screen 10 in one of the specified areas 12–20 determines the effect of the rotary knob on the waveform 22. FIG. 2 and the following table are illustrative of the interrelationship of touching the touch screen 10 and rotating the rotary knob.

| Touch Location | Touch Action | Knob Action | Result |
| --- | --- | --- | --- |
| Horizontal Axis | Touch | Rotate CW | Zoom in horizontally about the horizontal touch point |
| Vertical Axis | Touch | Rotate CW | Zoom in vertically about the vertical touch point |
| Graphics Area | Touch | Rotate CW | Zoom in horizontally and vertically about the touch point |
| Horizontal Scroll | Touch | Rotate CW | Pan right |
| Vertical Scroll | Touch | Rotate CW | Pan up |

Pan up means that the scroll box moves upwards and the waveform and vertical axis move downwards, i.e., the viewing window slides up. Pan right moves the scroll box to the right and the waveform and horizontal axis to the left, i.e., the viewing window slides to the right. Rotating the knob counterclockwise (CCW) reverses the sense of the result—zoom out instead of zoom in, pan down instead of pan up, etc.

For example if an operator touches the vertical axis area 14 at the value shown of −22.2, then operation of the knob results in zoom about that vertical point so that intervals above that point are multiplied by a plus gain factor and those below that point are multiplied by a negative gain factor. If the operator touches the graphics area 20 at a point corresponding to the values of −1.2 vertical and 30 horizontal, then the intervals above the vertical point are multiplied by a positive gain factor, below the vertical point by a negative gain factor, to the right of the horizontal point by a positive gain factor (offset), to the left of the horizontal point by a negative gain factor (offset) for zoom in both directions simultaneously. Touching in either of the scroll areas 16, 18 results in scrolling in the specified direction according to the rotation of the rotary knob. Alternatively scrolling may be achieved without using the rotary knob by moving the touch point along the selected scroll area 16, 18 and the waveform 22 scrolls across the graphic area 20 accordingly.

Figure 3:
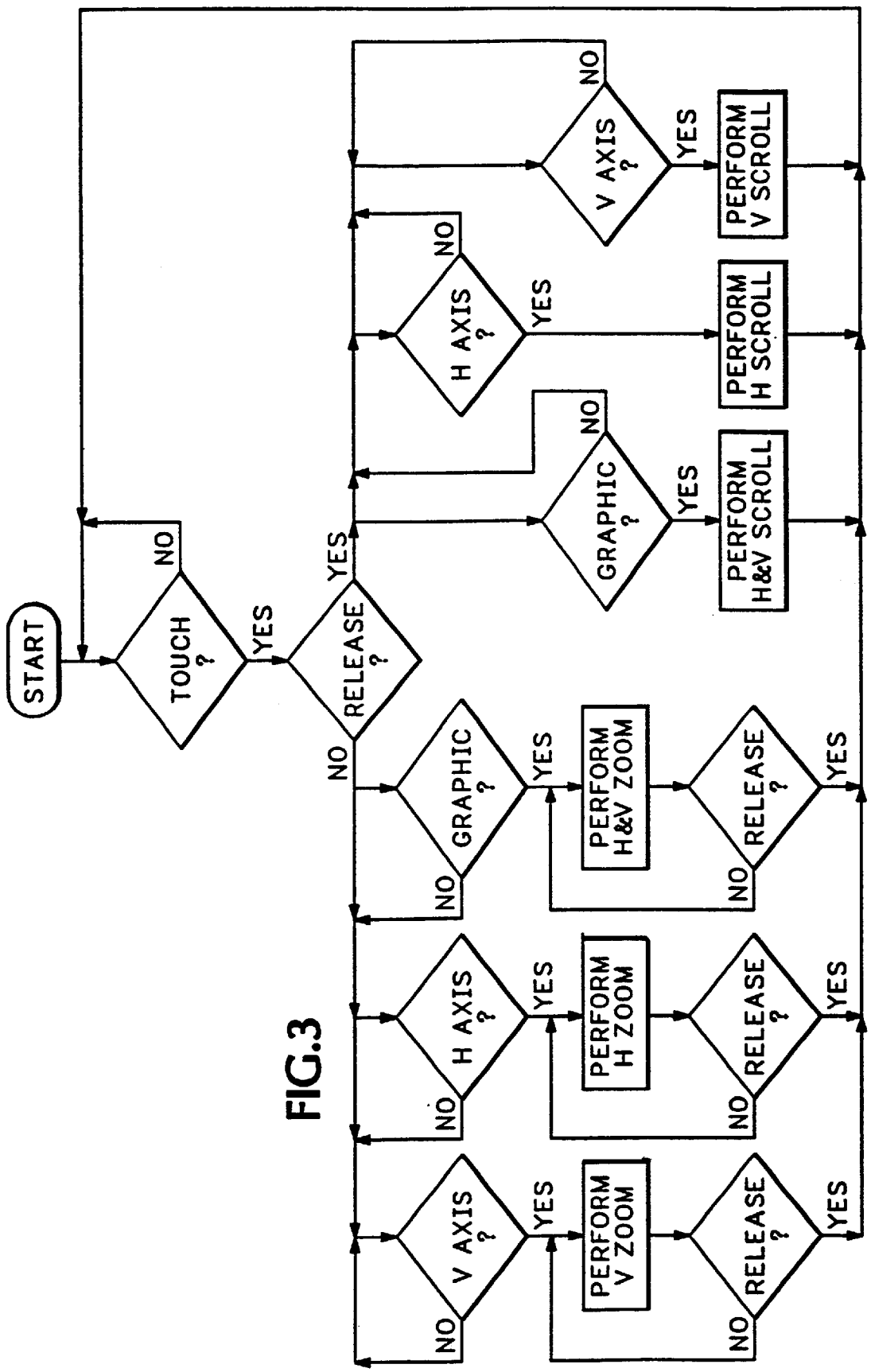
FIG. 3 is a flow chart view of an alternative method for touch controlled zoom and pan of a graphics display according to the present invention.

If the scroll areas 16, 18 are not used, then panning may be accomplished by discriminating between "touch and hold" and "touch and go" as shown in FIG. 3. For example if the rotary knob is rotated while the screen is touched and the touch is maintained, then a zoom operation is performed.

If the screen is touched at either the horizontal or vertical axis area 12, 14 and released, then rotation of the rotary knob performs the appropriate scroll function. Alternatively the "touch and hold" may be used to select the pan function while the "touch and go" may be used to select the zoom function. A logical extension is to perform a down-and-left pan when there is a "touch and go" in the graphics area 20.

Thus the present invention provides touch controlled zoom and pan of graphics displays in both one and two dimensions without requiring function buttons, but only a touch screen with defined areas and a rotary encoder knob.

What is claimed is:

1. A method of touch controlled zoom and pan of a graphic display comprising the steps of:
    determining a function and a touch point with respect to the graphic display by touching a touch screen in one of a plurality of defined areas;
    zooming the graphic display about the touch point according to the rotation of a rotary encoder knob if the function is a zoom function;
    panning the graphic display according to the rotation of the rotary encoder knob if the function is a pan function.

2. The method as recited in claim 1 wherein the defined areas include a horizontal axis area, a vertical axis area and a graphic display area.

3. The method as recited in claim 2 wherein the defined areas further include a horizontal scroll area and a vertical scroll area.

4. The method as recited in claim 3 wherein the determining step includes the steps of:
    selecting a horizontal zoom function when the horizontal axis area is touched and selecting the touch point for the graphic display according to the location within the horizontal axis area that is touched;
    selecting a vertical zoom function when the vertical axis area is touched and selecting the touch point for the graphic display according to the location within the vertical axis area that is touched;
    selecting a two-dimensional zoom function when the graphics display area is touched and selecting the touch point for the graphic display according to the location within the graphics display area that is touched;
    selecting a horizontal pan function when the horizontal scroll area is touched; and
    selecting a vertical pan function when the vertical scroll area is touched.

5. The method as recited in claim 2 wherein the determining step comprises the steps of:
    selecting one of a zoom or pan function when the screen is touched and the contact maintained while the rotary encoder knob is rotated; and
    selecting the other of the zoom or pan function when the screen is touched and released before the rotary encoder knob is rotated.

6. The method as recited in claim 5 wherein the zoom function selecting step comprises the steps of:
    selecting a horizontal zoom function when the touch is in the horizontal axis area with the touch point being determined by the location within the horizontal axis area that is touched;
    selecting a vertical zoom function when the touch is in the vertical axis area with the touch point being determined by the location within the vertical axis area that is touched; and
    selecting a two-dimensional zoom function when the touch is in the graphics display area with the touch point being determined by the location within the graphics display area that is touched.

7. The method as recited in claims 5 or 6 wherein the pan function selecting step comprises the steps of:
    selecting a horizontal pan function when the touch is in the horizontal axis area; and
    selecting a vertical pan function when the touch is in the vertical axis area.

8. The method as recited in claim 7 wherein the pan function selecting step further comprises the step of selecting a two-dimensional pan function when the touch is in the graphics display area.

9. The method as recited in claim 1 wherein the panning step comprises the step of sliding a touch contact along a scroll area when the function is determined by the determining step to be a pan function without using the rotary encoding knob.

\* \* \* \* \*